United States Patent [19]

Inoue et al.

[11] Patent Number: 5,773,355
[45] Date of Patent: Jun. 30, 1998

[54] METHOD FOR MANUFACTURING SEMICONDUCTOR SUBSTRATE

[75] Inventors: Shunsuke Inoue, Yokohama; Mamoru Miyawaki, Isehara; Yoshihiko Fukumoto, Atsugi, all of Japan

[73] Assignee: Canon Kabushiki Kaisha, Tokyo, Japan

[21] Appl. No.: 864,904

[22] Filed: May 29, 1997

Related U.S. Application Data

[63] Continuation of Ser. No. 416,359, Apr. 4, 1995, abandoned.

[30] Foreign Application Priority Data

Apr. 8, 1994 [JP] Japan ..................... 6-070396

[51] Int. Cl.⁶ ............................................. H01L 21/76
[52] U.S. Cl. ..................... 438/459; 148/DIG. 12
[58] Field of Search ..................... 438/459, 517; 148/DIG. 12

[56] References Cited

U.S. PATENT DOCUMENTS

| 4,939,101 | 7/1990 | Black et al. .......................... 437/62 |
| 5,098,861 | 3/1992 | Blackstone .......................... 437/974 |
| 5,213,986 | 5/1993 | Pinker et al. .......................... 437/62 |
| 5,234,535 | 8/1993 | Beyer et al. .......................... 437/62 |
| 5,362,667 | 11/1994 | Linn et al. .......................... 437/62 |
| 5,453,394 | 9/1995 | Yonehara et al. .......................... 437/62 |
| 5,455,193 | 10/1995 | Egloff .......................... 437/12 |

FOREIGN PATENT DOCUMENTS 2-49466  2/1990  Japan .

OTHER PUBLICATIONS

W. P. Maszara et al., "Epi–less bond–and–etch–back silicon–on–insulator by MeV ion implantatin", Applied Physics Letters, vol. 58, No. 24, Jun. 17, 1991, New York, U.S. pp. 2779–2781.

Primary Examiner—John Niebling
Assistant Examiner—S. Mulpuri
Attorney, Agent, or Firm—Fitzpatrick, Cella, Harper & Scinto

[57] ABSTRACT

A semiconductor substrate includes a semiconductor layer, where the density of an impurity is reduced by out diffusion, provided on an insulating layer. In a method for manufacturing such a semiconductor substrate, a semiconductor substrate including a high-density impurity layer at the side of its surface is bonded to another substrate having an insulating layer. Thereafter, the semiconductor substrate is removed, and the impurity density of the remaining high-density impurity layer is reduced by out diffusion.

10 Claims, 12 Drawing Sheets

- 101a : P-TYPE LAYER
- 105 : SiN FILM
- 102 : SiO2 FILM
- 103 : Si SUBSTRATE

- 104 : Si SUBSTRATE
- 101b : P+-TYPE LAYER

- 104 : Si SUBSTRATE
- 101b : P+-TYPE LAYER
- 105 : SiN FILM
- 102 : SiO2 FILM
- 103 : Si SUBSTRATE

- 101b : P+-TYPE LAYER
- 105 : SiN FILM
- 102 : SiO2 FILM
- 103 : Si SUBSTRATE

METHOD FOR MANUFACTURING SEMICONDUCTOR SUBSTRATE

This application is a continuation of application Ser. No. 08/416,359 filed Apr. 4, 1995, now abandoned.

BACKGROUND OF THE INVENTION

1. Field of the Invention

This invention relates to a semiconductor substrate and a method for manufacturing the same. More particularly, the invention is suitably applied to a silicon-on-insulator (hereinafter termed "SOI") substrate comprising a single-crystal silicon film formed on an insulating film, and to a method for manufactuing such a substrate.

2. Description of the Related Art

Recently, the SOI substrate has attracted notice as a high-performance substrate for an MOS (metal-oxide-semiconductor) integrated circuit, and as a substrate for a single-crystal thin-film-transistor (hereinafter termed "TFT") circuit for driving a liquid-crystal panel. However, it seems that it will take a long time before SOI substrates superior to conventional single-crystal substrates both in the cost and performance are practically used, because the following conditions necessary to provide an excellent SOI substrate are not yet satisfied. The conditions are:

1) Defects within single-crystal silicon must be sufficiently small.
2) The thickness of a silicon film must be uniform.
3) The density of an impurity in silicon must be sufficiently low.
4) There must be a degree of freedom in the thickness and the selection of a material for the insulator.
5) The substrate must be manufactured at a low cost.

A description will now be provided of the following five conventional SOI substrates and methods for manufacturing the same.

i) SIMOX (separation by implanted oxygen) substrate

This substrate is obtained by implanting high-dose-rate oxygen ions with high energy from the surface of a single-crystal silicon substrate, and annealing the silicon substrate at a high temperature. This substrate does not satisfy the above-described conditions 1), 4) and 5) because the defect density in the single crystal is equal to or greater than $10^3/cm^2$, the insulator is limited to silicon oxide, the thickness of the insulator has no degree of freedom, and a high-energy and high-dose-rate ion implantation process is very expensive.

ii) Recrystallized polysilicon substrate

This substrate is obtained by depositing polysilicon on an insulating substrate, and fusing and recrystallizing the deposited polysilicon by scanning the substrate with an energy beam, such as a laser beam or the like. This substrate does not satisfy the above-described conditions 1), 2) and 5) because projections and recesses having a period of an order of cm are produced during recrystallization, polysilicon grain boundaries remain and the crystal axis becomes irregular since it is difficult to realize uniform recrystallization, and the production cost is high since the energy beam is scanned at a low speed.

iii) Substrate obtained by bonding and polishing

This substrate is obtained by bonding two silicon substrates and then providing a thin silicon film by mechanical polishing. Since uniformity of the mechanical polishing is insufficient, uniformity of the silicon film on an insulating film cannot be obtained. Hence, the above-described condition 2) is not satisfied.

iv) Substrate obtained by bonding and etching step

This substrate is obtained by bonding two silicon substrates and then providing a thin silicon film by etching. In the surface of the substrate to be thinned, a low-density impurity layer is formed in advance on a high-density impurity layer. A hydrofluoric-nitric-acid-type solution (a mixed solution of HF and $HNO_3$) for selectively etching the high-density impurity layer is used as an etching solution.

The structure comprising the high-density impurity layer and the low-density impurity layer, and selectivity of the etching solution are key factors for producing such a substrate. The above-described structure is obtained by a method of forming the low-density impurity layer by epitaxial growth, a method of forming the high-density impurity layer by high-energy and high-dose-rate ion implantation, or the like.

In the case of epitaxial growth, if hillocks, particles, stacking faults and the like are produced during the growth, voids, where a part of silicon is not bonded, are produced during a bonding operation, thereby increasing defects in a broad sense. In addition, since the etching rate of a hydrofluoric-nitric-acid-type etching solution is determined by supply of the solution, it is very difficult to uniformly etch the entire surface of the wafer. Furthermore, expensive processes, such as epitaxial growth, high-energy and high-dose-rate ion implantation and the like, are required for producing this substrate. Hence, the above described conditions 1), 2) and 5) are not satisfied.

v) Substrate obtained by bonding, etching step, and reduction of the impurity density by oxidation A method for producing this substrate has been proposed by Imai (Japanese Patent Laid-Open Application (Kokai) No. 2-49466 (1990)). After bonding a first substrate having a surface in which a $p^+$-type impurity has been diffused, and a second substrate, the first substrate is etched off except the $p^+$-type layer by selective etching. Then, a part of the $p^+$-type layer is oxidized, and the density of the $p^+$-type impurity is reduced by transferring the $p^+$-type impurity into the oxidized layer.

EPW (a mixed solution of ethylenediamine, pyrocatechol and water) is used as the etching solution. This solution has excellent selectivity and etching uniformity. Since two single-crysal silicon substrates are bonded together, the defect density in this substrate is the same as that in a bulk wafer. Furthermore, since expensive processes, such as high-energy ion implantation, epitaxial growth and the like, are not used, the production cost can be sufficiently reduced.

However, since in the above-described method v), the minimum impurity density in the film is reduced only to about $10^{17}$ $cm^{-3}$, this substrate can be used only for limited applications. For example, when manufacturing a CMOS (complementary metal-oxide semiconductor) integrated circuit, it is desirable to make the impurity density in the film about $10^{16}$ $cm^{-3}$ at most, preferably $10_{15}$ $cm^{-3}$ in order to form well regions of PMOS transistors. Particularly in a circuit handing a high voltage of equal to or greater than 10 V, such as a liquid-crystal-panel driving circuit, a high-density region must not remain in order to provide resistance against high voltage.

In the above-described method v), as disclosed in Japanese Patent Laid-Open Application (Kokai) No. 2-49466 (1990)), the impurity density can be reduced by transferring the impurity into a thick oxide layer formed by "making the thickness of the initial $p^+$-type layer at least 1.0 μm, and increasing the oxidation time". However, taking into consideration the relationship between the amount of the oxidized layer and the oxidation time, an additional process time of a few hours is required every time the thickness of the oxide film increases by 0.1 μm. Furthermore, when the thickness of the p$^+$-type layer is increased in order to obtain an Si film having a thickness of 0.3–0.7 μm necessary for a liquid-crystal panel, since the boron profile in the vicinity of the SiO$_2$/Si boundary is flat, the density of boron in the Si film starts to effectively decrease only when the Si film becomes sufficiently thin in oxidizing the surface. Accordingly, a sufficient decrease in the impurity density cannot be expected.

In the above-described method v), as disclosed in Japanese Patent Laid-Open Application (Kokai) No. 2-49466 (1990)), it is possible to "form an undoped amorphous or polycrystalline Si film, or the like on a p$^+$-type layer, diffuse boron by heat treatment, oxidize the film, and then remove the formed Si film". This approach, however, requires many processes, such as a film deposition process, a heat treatment process, an oxidation process and the like, thereby detracting from this method's low cost and superiority to other conventional approaches.

As described above, the method v) is a technique of manufacturing a substrate within a limited range of "the structure of a very thin film of equal to or less than 0.1 μm and the boron density of higher than $10^{17}$ cm$^{-3}$". Hence, the substrate v) cannot be used as an SOI substrate for all kinds of applications.

SUMMARY OF THE INVENTION

The present invention provides a semiconductor substrate comprising a semiconductor layer, where the density of an impurity is reduced by out diffusion, provided on an insulating layer.

The present invention also provides a method for manufacturing a semiconductor substrate comprising the steps of forming a semiconductor substrate including a high-density impurity layer at the side of its surface, bonding of the high-density impurity layer of the semiconductor substrate and an insulating layer provided on another substrate, removing the semiconductor substrate except the high-density impurity layer, and reducing the impurity density of the remaining high-density impurity layer by out diffusion.

The present invention further provides a method for manufacturing a semiconductor substrate comprising the steps of forming a semiconductor substrate including an insulating layer in contact with a high-density impurity layer at the side of its surface, bonding the surface of the insulating layer of the semiconductor substrate and a surface of another substrate, removing the semiconductor substrate except the high-density impurity layer and the insulating layer, and reducing the impurity density of the remaining high-density impurity layer by out diffusion.

The out diffusion is a phenomenon in which an impurity within a semiconductor substrate is diffused and discharged into an atmosphere outside the substrate by heat treatment or the like.

The semiconductor substrate of the present invention includes a semiconductor layer, in which the density of an impurity is reduced by out diffusion, on an insulating layer. Accordingly, the present invention realizes a low-impurity-density semiconductor substrate (an SOI substrate or the like) with a wider range of the thickness of a semiconductor film than in conventional approaches.

The method for manufacturing a semiconductor substrate of the present invention manufactures the above-described semiconductor substrate of the present invention by bonding two substrates. A low impurity density is realized by bonding a semiconductor substrate having a high-density impurity layer at the side of its surface and a substrate having an insulating surface, or by bonding a semiconductor substrate having an insulating layer in contact with a high-density impurity layer at the side of its surface and a surface of another substrate, thereafter forming the high-density impurity layer on the insulating layer by removing the semiconductor substrate, and reducing the impurity density of the high-density impurity layer by out diffusion.

According to the present invention, it is possible to provide a semiconductor substrate (for example, an SOI substrate) having a low-impurity-density layer obtained by out diffusion after selectively leaving a high-density impurity layer. Thus, it is possible to provide a semiconductor substrate having the following features:

1) Crystal defects as small as in a bulk wafer
2) Excellent film-thickness distribution
3) A sufficiently low impurity density in a semiconductor, such as silicon or the like
4) The thickness and the material of an insulating layer can be freely selected
5) Low cost Such a semiconductor substrate can be applied to a wide range of applications, such as high-speed and low-powerconsumption integrated circuits, driving panels for LCD's (liquid-crystal displays), power IC's (integrated circuits), and the like.

DETAILED DESCRIPTION OF THE PREFERRED EMBODIMENTS

Preferred embodiments of the present invention will now be described in detail with reference to the drawings.

First Embodiment

Figure 1:
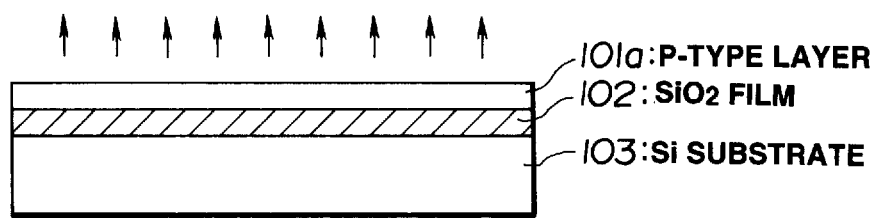
FIG. 1 is a cross-sectional view illustrating the configuration of an SOI substrate according to a first embodiment of the present invention.

FIG. 1 is a cross-sectional view illustrating an SOI substrate according to a first embodiment of the present invention. As shown in FIG. 1, a silicon dioxide film 102 having a thickness of 500–20000 angstroms is present on a silicon substrate 103. A p-type silicon layer 101a whose density is reduced by out diffusion is present on the silicon dioxide film 102. In FIG. 1, arrows indicate the direction of the out diffusion. An n-type substrate or a p-type substrate may be used as the silicon substrate 103, and the resistivity of the silicon substrate 103 may have any value between 0.001 and $10^6$ Ω·cm.

Figure 2A:
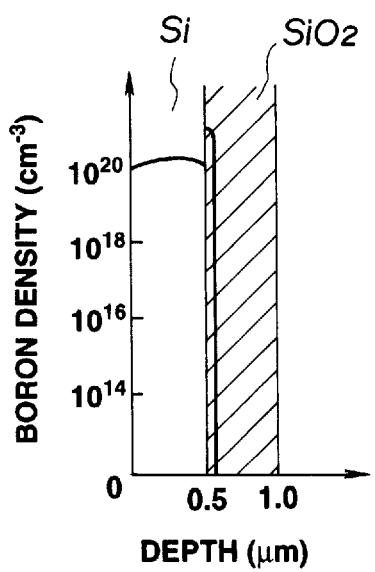
FIG. 2(a) illustrates an impurity profile before out diffusion in the first embodiment.
Figure 2B:
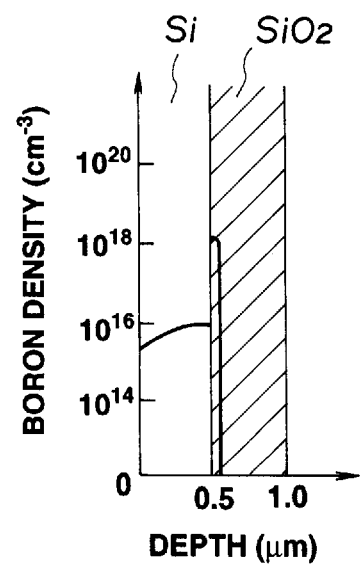
FIG. 2(b) illustrates an impurity profile after out diffusion in the first embodiment.

FIGS. 2(a) and 2(b) illustrate density profiles before and after out diffusion, respectively, when the thickness of the p-type silicon layer 101a equals 5000 angstroms. The out diffusion shown in FIGS. 2(a) and 2(b) is according to the following method for manufacturing an SOI substrate. As shown in FIGS. 2(a) and 2(b), the impurity density of $10^{20}$ $cm^{-3}$ of boron of the p-type silicon layer 101a can be reduced to about $10^{16}$ $cm^{-3}$.

Figure 3:
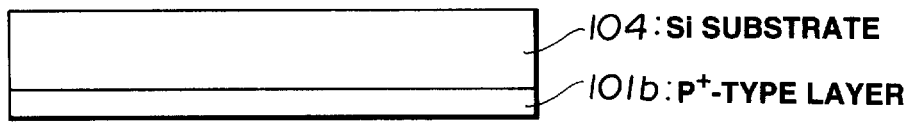
FIGS. 3 through 5 are cross-sectional views illustrating a method for manufacturing an SOI substrate according to the first embodiment.

A description will now be provided of the method for manufacturing an SOI substrate according to the first embodiment with reference to FIGS. 3 through 5 and FIG. 1. First, as shown in FIG. 3, a high-density boron-doped $p^+$-type layer 101b is formed on the surface of an n-type or p-type silicon substrate 104. Any method, such as ion implantation of boron, solid-phase diffusion from spin-on glass (SOG) or a polyboron film (PBF), solid-phase diffusion from BSG (borosilicate glass), vapor-phase diffusion from BN (boron nitride), or the like may be used for forming the $p^+$-type layer 101b. In the present embodiment, after performing spin coating of a polyboron film (product name: MK-31) made by Tokyo Ohka Kogyo Co., Ltd., the film was subjected to heat treatment for 30 minutes at 140° C. in the atmospheric air, and then to heat treatment for 30 minutes at 600° C. in $O_2$ gas. The film was further subjected to heat treatment for 30 minutes at 1050° C. in $N_2$, and a $p^+$-type layer 101b having a surface density of $10^{20}$ $cm^{-3}$ and a depth of 1.2 μm was obtained. In order to obtain a sufficient selection ratio in the following etching process, it is desirable that the boron density is at least $10^{19}$ $cm^{-3}$, and more preferably at least $5\times10^{19}$ $cm^{-3}$. The surface density can be freely set by changing the solution limit of boron in silicon by changing the above-described heat treatment temperature 1050° C.

Figure 4:
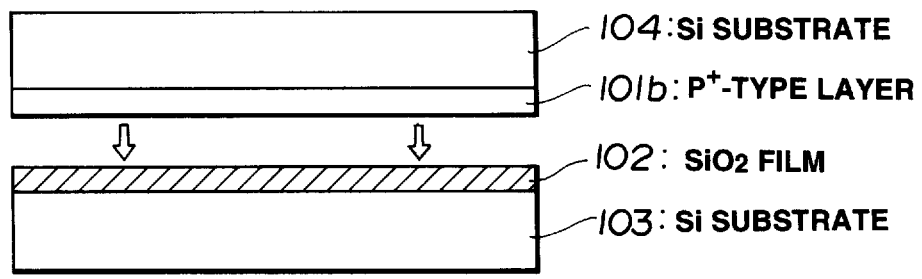
Figure 5:
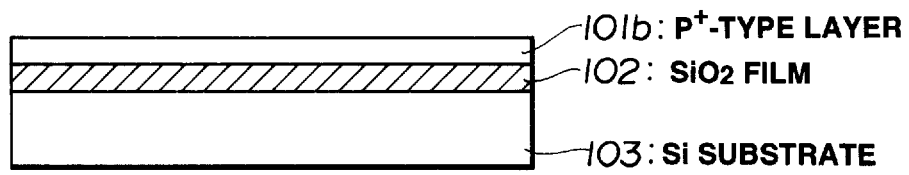

Then, as shown in FIG. 4, this wafer is bonded to another silicon substrate 103 whose surface is subjected to thermal oxidation. A solution for washing them before bonding them may be a mixed solution of $H_2SO_4$ and $H_2O_2$, a diluted HF solution, or a mixed solution of $NH_4OH$, $H_2O_2$ and $H_2O$, or a combination of these solutions. In the present embodiment, in order to prevent the surface of the $p^+$-type layer 101b from being rough, they were washed at a temperature of 50°–100° C. using a solution of $NH_4OH:H_2O_2:H_2O=$ about 0.05:1:5. Thereafter, the bonded wafers are subjected to heat treatment in order to increase the bonding strength. The heat treatment may be performed at at least 400° C., and preferably at at least 800° C. in order to provide a sufficiently strong bonding. $N_2$, $O_2$ or Ar, or a mixture of these gases may be used as the atmospheric gas for the heat treatment. The heat treatment time depends on the heat treatment temperature, and may be determined in consideration of an increase in the depth of the $p^+$-type boron-doped layer 101b. In the present embodiment, the heat treatment was performed for 30 minutes at 800° C. in $N_2$.

Then, the Si substrate 104 is removed, for example, by:
(i) using a grinder and a selective-etching solution,
(ii) using a nonselective-etching solution and a selective-etching solution, or
(iii) using a selective-etching solution.

In the above-described method (i), as disclosed, for example, in Japanese Patent Laid-Open Application (Kokai) No. 2-49466 (1990), the Si substrate 104 is mechanically ground to a desired thickness of 10 μm±2 μm. Then, only the $p^+$-type layer 101b is left after using a mixed etching solution of 17 milliliters of ethylenediamine, 3 grams of pyrocatechol and 8 milliliters of $H_2O$ heated to 100° C., or a mixed solution of 20-% KOH and 1–5-% IPA (isopropyl alcohol) heated to 800° C.

In the above-described method (ii), the Si substrate 104 is etched to about 10 μm by a KOH solution not including IPA, or a TMAH solution. Then, only the $p^+$-type layer 101b is left using the above-described etching solution. In the present embodiment, the Si substrate 104 was first thinned to 10 μm using a 20-% KOH solution maintained at 80° C., and then the remaining Si substrate 104 was removed using a 20-% KOH solution including 2-% IPA maintained at 80° C. The etching speed for a silicon layer having a boron density of equal to or less than $10^{19}$ $cm^{-3}$ is about 0.5 μm/min, but the etching speed for a silicon layer having a boron density of $10^{20}$ $cm^{-3}$ is equal to or less than 10 angstroms/min. Accordingly, a substrate having variations of ±2 μm in the thickness can be thinned to a substrate having variations of about the diffusion depth of boron. Actually, however, since boron has a density profile, the inventors of the present invention obtained a substrate having a thickness of 5000±70 angstroms (see FIG. 5).

Figure 6:
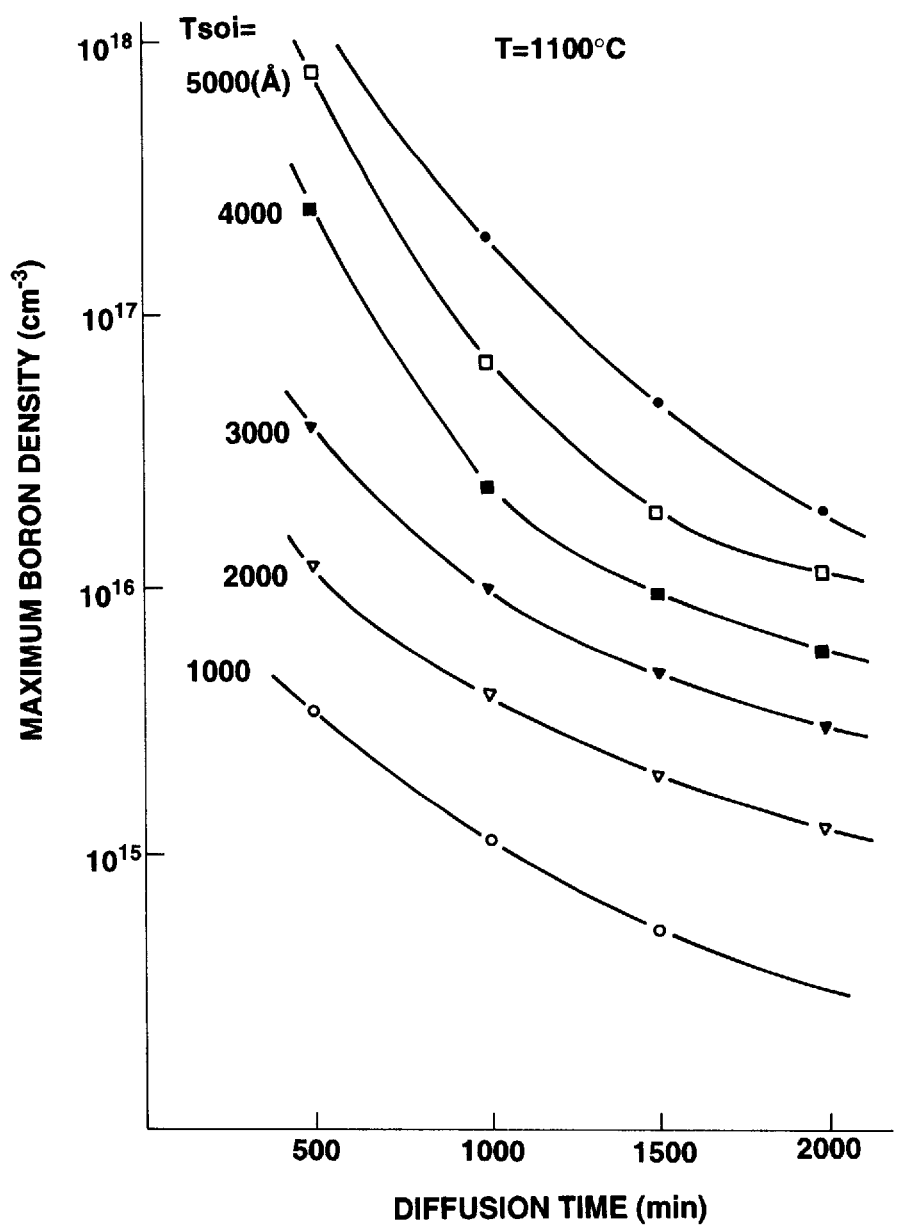
FIG. 6 is a graph illustrating a manner in which the impurity density decreases by out diffusion in the present invention.

Thereafter, by performing heat treatment in an inert gas, such as $N_2$, Ar or the like, or in a reducing gas, such as $H_2$ or the like, an SOI substrate as shown in FIG. 1 was obtained by reducing the density of boron in the $p^+$-type layer 101b. The degree of a decrease in the density can be controlled by changing the temperature and the time of the heat treatment. Although a sufficient effect of the present embodiment can be obtained by heat treatment at at least 1000° C., it is desirable that the temperature is as high as possible in order to shorten the time of the heat treatment. In an $N_2$ gas, however, a temperature equal to or higher than 1150° C. is not preferable because the formation of a thermal nitride film starts at that temperature. In FIG. 6, the highest boron density within an Si film when the Si film is subjected to heat treatment at 1100° C. in an $N_2$ gas is plotted for the heat treatment time. In FIG. 6, the thickness of the Si film is plotted as parameters. The highest boron density before the heat treatment is $1\times10^{20}$ $cm^{-3}$. As can be understood from FIG. 6, the boron density can be more easily reduced by out diffusion as the Si film thickness is reduced, but the boron density can be reduced to about $10^{16}$ $cm^{-3}$ even for a thickness of about 5000 angstroms. In the present embodiment, an SOI substrate having the maximum boron density of $1.2\times10^{16}$ $cm^{-3}$ was obtained by performing heat treatment of an Si layer having a thickness of 5000 angstroms for 2000 minutes at 1100° C. in $N_2$. The quality of the Si layer of the obtained SOI substrate was as good as that of a bulk wafer.

Although in the present embodiment a p-type impurity layer was used, an n-type impurity layer may also be used. In this case, the n-type layer may be obtained using ion implantation of phosphor, arsenic or the like, a solid-phase diffusion from PSG or spin-on glass, or the like. The above-described selective-etching solution for the p-type impurity layer may also be used. Furthermore, out diffusion may also be performed as in the case of the p-type impurity layer. In this case, it is desirable from the viewpoint of the heat treatment time to use phosphorous having a diffusion constant similar to that of boron than to use arsenic having a small diffusion constant.

According to the present embodiment, it is possible to obtain an SOI substrate in which defects are as small as in a bulk wafer, the film thickness distribution is very small, the impurity density in silicon is equal to or less than $10^{16}$ cm$^{-3}$, and the thickness and the material of the insulating film can be freely selected, and which can be manufactured at a low cost.

Figure 7:
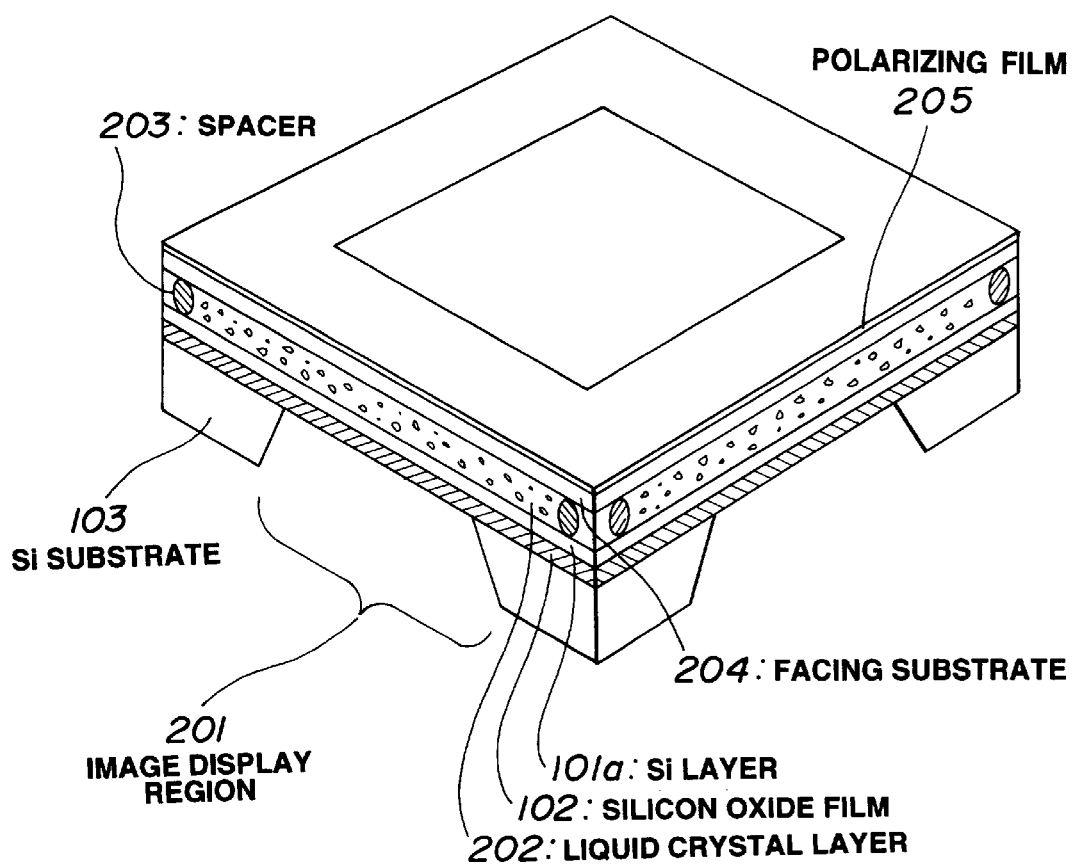
FIG. 7 is a schematic diagram illustrating a liquid-crystal panel manufactured according to the present invention.

Trial production of a liquid-crystal panel incorporating a driving circuit was performed using the above-described SOI substrate (see FIG. 7). In FIG. 7, there are shown an image display region 201, a liquid-crystal layer 202, a spacer 203, a facing substrate 204, and a polarizing film 205. The thickness of the Si layer 101a was 5000±70 angstroms, and a CMOS circuit was adopted. The size of each pixel was 20 $\mu$m×20 $\mu$m, and a color liquid-crystal panel comprising three hundred thousand pixels was produced. By using the SOI substrate of the present embodiment, a uniform film thickness was obtained, uniform characteristics were obtained, and the production yield was improved. In addition, since the number of defects was small, the rate of generation of leakage in TFT's (thin-film transistors) for driving pixels was greatly reduced. As a result, a panel having 64 gradation steps and a contrast equal to or greater than 100:1 was obtained.

Second Embodiment

Figure 8:
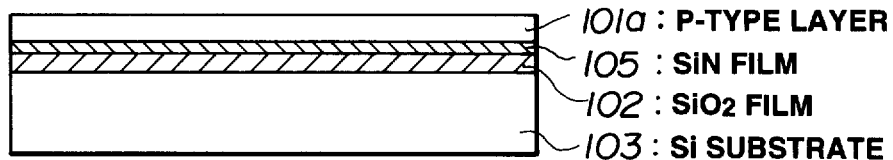
FIGS. 8 through 11 are cross-sectional views illustrating a method for manufacturing an SOI substrate according to a second embodiment of the present invention.

FIG. 8 illustrates the structure of an SOI substrate according to a second embodiment of the present invention. As shown in FIG. 8, an SiO$_2$ film 102, a silicon nitride film 105, a silicon layer 101a whose impurity density is reduced by out diffusion are present in this sequence on an Si substrate 103. The SiO$_2$ film 102 may have a thickness between 500 and 2000 angstroms, and the silicon nitride film 105 may have a thickness between 50 and 10000 angstroms.

The present embodiment has a feature in that a layer having a capability of preventing impurity diffusion is present immediately below the silicon layer 101a, so that entrance of an impurity into the SiO$_2$ layer 102 during out diffusion can be prevented. As a result, it is possible to efficiently perform out diffusion, and to obtain an SOI substrate including an Si layer having a lower impurity density.

Figure 9:
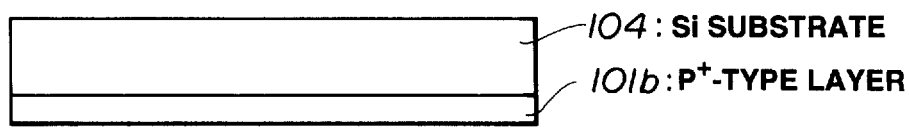
Figure 10:
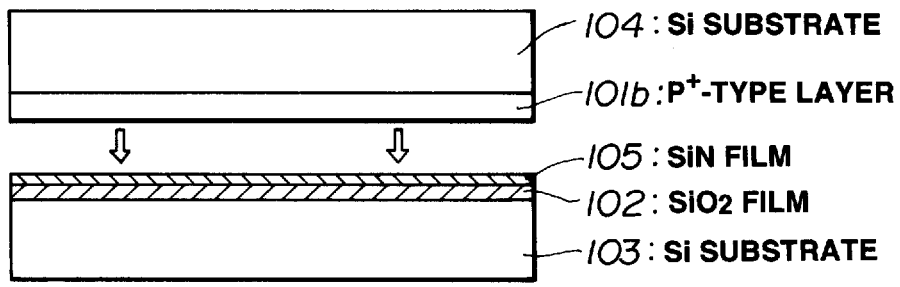
Figure 11:
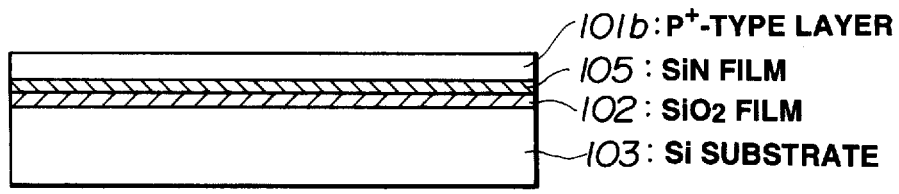

FIGS. 9 through 11 illustrate a method for manufacturing the SOI substrate of the present embodiment. A high-density p$^+$-type impurity layer 101b is formed in an Si substrate 104 shown in FIG. 9 in the same manner as in the first embodiment. In the present embodiment, after implanting boron into the Si substrate 104 with a dose rate of $10^{16}$ cm$^{-2}$ and energy of 30 keV (kiloelectron volt), the implanted layer was activated by annealing the Si substrate 104 for 5 minutes at 100° C. The p$^+$-type layer 101b having a surface impurity density of 1×10$^{20}$ cm$^{-3}$ and a depth of 1.2 $\mu$m was obtained.

Then, as shown in FIG. 10, the p$^+$-type layer 101b is bonded to a second substrate. A film having a capability of preventing impurity diffusion is formed on the surface of the second substrate. For example, the film may be a silicon nitride layer, or a laminated layer comprising a silicon nitride film and a silicon dioxide film. In the present embodiment, the laminated layer was adopted. That is, a thermal oxide film having a thickness of 8000 angstroms was grown on the silicon substrate 103, and a silicon nitride film having a thickness of 100 angstroms was formed thereon by low-pressure CVD (chemical vapor deposition). PSG (phosphosilicate glass), BPSG (boron phosphosilicate glass) or the like may be used for the silicon oxide film, and plasma CVD, thermal nitriding or the like may be used for forming the silicon nitride film. The nitride film does not necessarily have a composition of Si$_x$N$_y$, but even a nitride oxide film Si$_x$O$_y$N$_z$ obtained by performing partial nitriding of an oxide film has a function of preventing impurity diffusion. Such a second substrate and the above-described first substrate are bonded together after cleaning them.

Then, the Si substrate 104 is etched off. Any of all the methods used in the first embodiment can be used for the etching. In the present embodiment, as in the first embodiment, after thinning the Si substrate 104 to 10 $\mu$m using a 20-% KOH solution, selective etching was performed using a 20-% KOH solution including 2-% IPA (see FIG. 11). A uniformity of 5000±70 angstroms was obtained for the p$^+$-type Si layer 101b.

Figure 12:
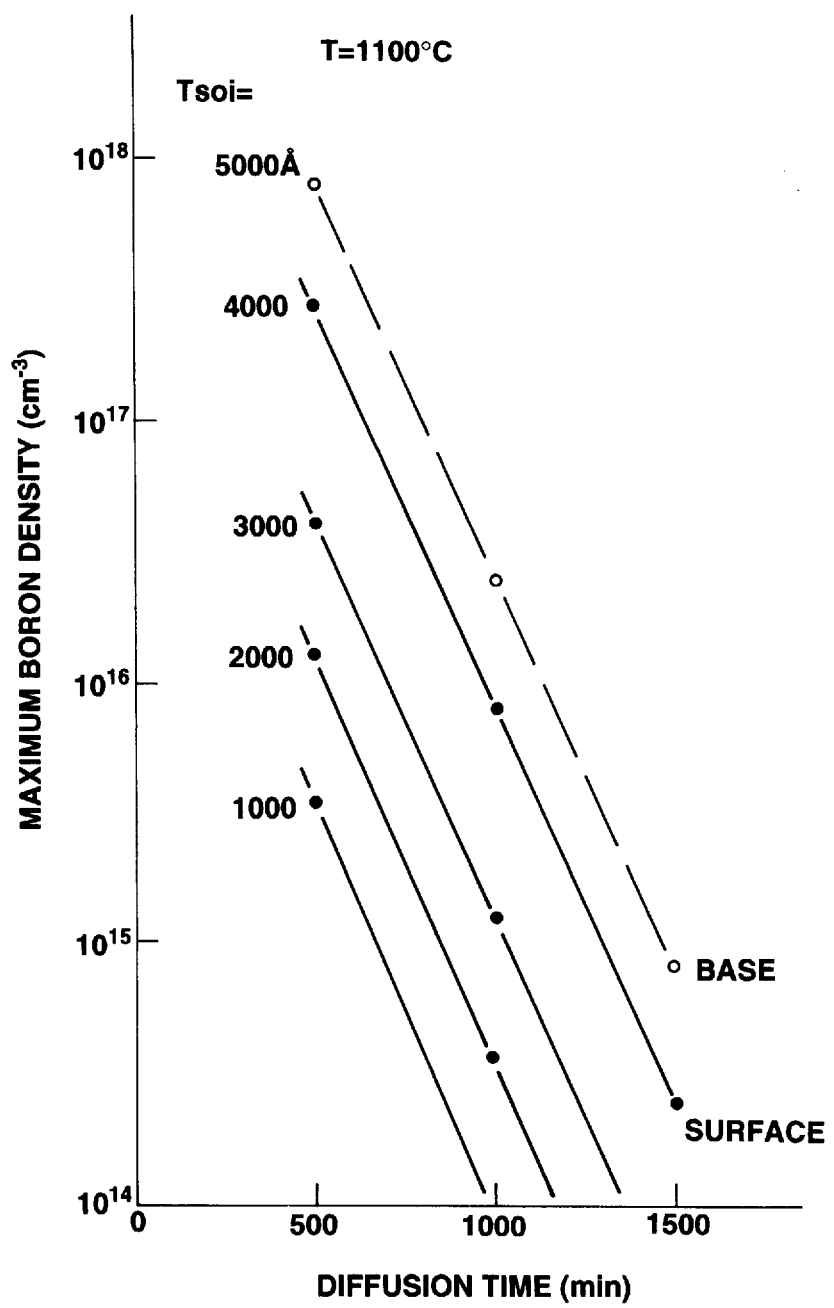
FIG. 12 is a graph illustrating a manner in which the impurity density decreases in the second embodiment.

Thereafter, the SOI substrate shown in FIG. 8 was obtained by reducing the impurity density in the p$^+$-type layer 101b in an Ar gas. FIG. 12 illustrates the maximum boron density as a function of the thermal treatment time at 1100° C. Since out diffusion can be efficiently performed due to the diffusion-preventing capability of the silicon nitride film, the boron density can be reduced in a shorter processing time. In the present embodiment, it is possible to reduce the boron density to equal to or less than 8×10$^{14}$ cm$^{-3}$ by performing heat treatment for 1500 minutes at 1100° C. The number of defects within the Si layer was similar to that in a bulk wafer. Although in the present embodiment a description has been provided of the p-type impurity, the present embodiment may also be applied to an n-type impurity in the above-described manner.

In the second embodiment, the effect of reducing the impurity density is particularly pronounced from among the effects described in the first embodiment. Accordingly, the SOI substrate can be used for a wider range of applications. Furthermore, since the heat treatment time for obtaining the same impurity density is shorter than in the first embodiment, the substrate can be produced with a lower cost.

Third Embodiment

Figure 13:
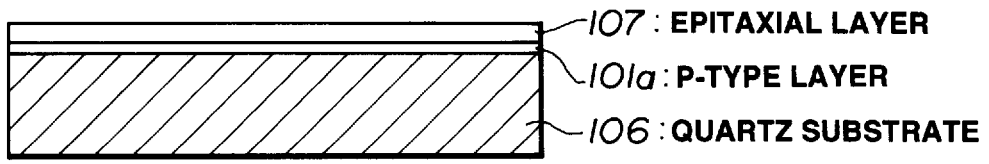
FIGS. 13 through 17 are cross sectional views illustrating a method for manufacturing an SOI substrate according to a third embodiment of the present invention.

FIG. 13 illustrates the structure of an SOI substrate according to a third embodiment of the present invention. As shown in FIG. 13, a p-type silicon layer 101a whose impurity density is reduced by out diffusion, and an epitaxial silicon layer 107 are laminated in this sequence on a quartz substrate 106. The present embodiment has features in that the thickness of a Si layer of an SOI substrate has a degree of freedom due to the presence of an epitaxial layer, and that the structure of an SOI substrate and a method for manufacturing such an SOI substrate effective for a quartz substrate, for which high-temperature heat treatment is difficult to perform, are shown. That is, the thickness of the silicon layer 101a whose impurity density is reduced by out diffusion is made very thin (<1000 angstroms, and preferably <500 angstroms), and a silicon layer having a desired thickness is obtained by performing epitaxial growth making the single-crystal layer growth nuclei.

Figure 14:
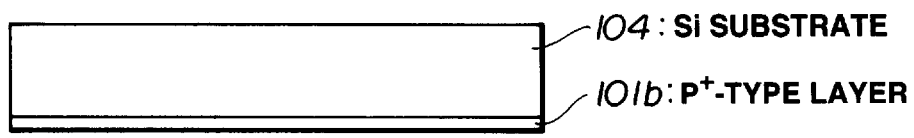

FIGS. 14 through 17 illustrate a method for manufacturing the SOI substrate of the present embodiment. First, as shown in FIG. 14, a high-density p$^+$-type impurity layer 101b is formed in the surface of an Si substrate 104. In order to make the depth of the p$^+$-type layer 101b as small as possible, ion implantation of BF$^{2+}$ or diffusion from a solid phase for a short time period is desirable. In order to make the depth about 0.3 μm, heat treatment was performed after coating a polyboron film (PBF), and thereafter diffusion was performed for 30 minutes at 950° C.

Figure 15:
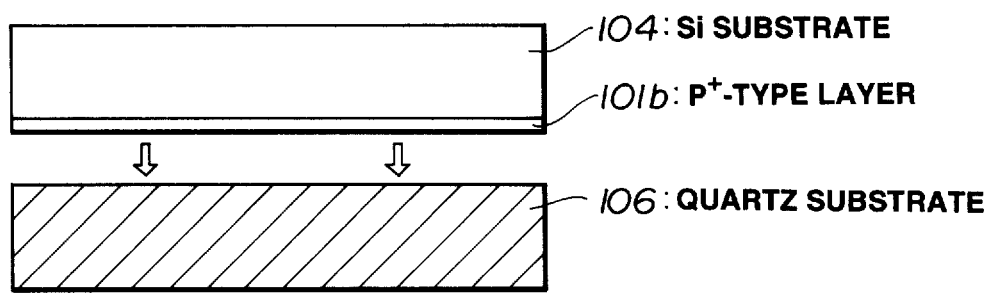

Then, as shown in FIG. 15, after removing the PBF, the p$^+$-type layer 101b was bonded to the quartz substrate 106. After washing the wafer and the quartz substrate 106 with an acid, or an alkali, or a combination thereof, they are bonded together and are then subjected to heat treatment at 150° C.

Figure 16:
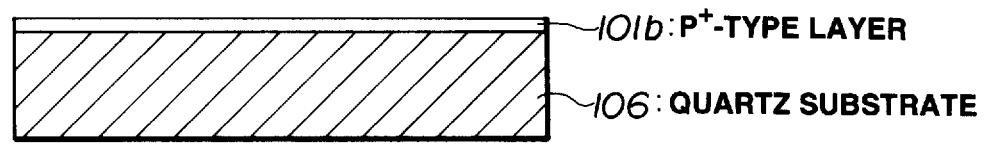

Thereafter, the Si substrate 104 is thinned to about 10 μm by mechanical polishing, and is then subjected to heat treatment at 200° C. Then, etching is performed with a selective etching solution (20-% KOH+2-% IPA) to thin the p$^+$-type layer 101b to (0.1±0.07) μm (FIG. 16).

Figure 17:
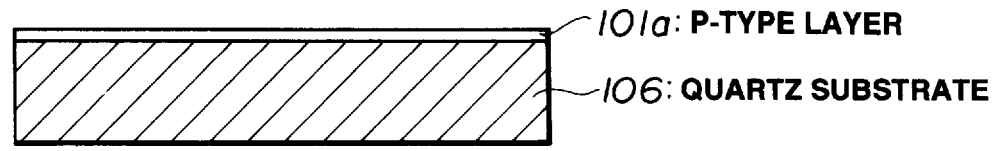

Then, out diffusion is performed by heat treatment at at least 900° C. (FIG. 17). Since the p$^+$-type layer 101b is thin, defects due to a stress between the quartz and the silicon layer are not produced even by heat treatment at 1000° C. However, in order to remove as many defects as possible, the silicon layer may be partially patterned and removed. In the present embodiment, a boron density of $1\times10^{16}$ cm$^{-3}$ could be obtained by performing out diffusion for 1000 minutes at 1050° C. Thereafter, the SOI substrate shown in FIG. 13 is obtained by growing the silicon epitaxial layer 107 by one of CVD, liquid-phase epitaxial, and MBE (molecular-beam epitaxy). The epitaxial growth may be performed within a range between 400° C. and 1000° C. In the epitaxial growth, control can be performed so as to provide a desired thickness of the silicon layer. In the present embodiment, an SiH$_2$Cl$_2$ gas was used as a source gas, and a silicon film having a thickness of 0.4 μm was grown under a reduced pressure at 800° C. The impurity in the p-type layer 101a also enters the epitaxial layer due to heat during the epitaxial growth, and the average boron density was reduced to $3\times10^{15}$ cm$^{-3}$. The final thickness of the silicon film was 5000±100 angstroms, and the silicon film obtained has sufficient properties for practical use. The number of defects in the silicon film was as small as in a bulk wafer. Also in the present embodiment, the p-type layer may be replaced by an n-type layer.

The present embodiment is suitable for the structure of an SOI substrate having a quartz substrate or the like for which high-temperature heat treatment is difficult to perform, and a method for manufacturing such an SOI substrate. Accordingly, an SOI substrate having a small number of defects, a uniform film thickness, and a low impurity density formed, particularly, on a quartz substrate can be manufactured with a less expensive process than in conventional approaches.

Fourth Embodiment

Figure 18:
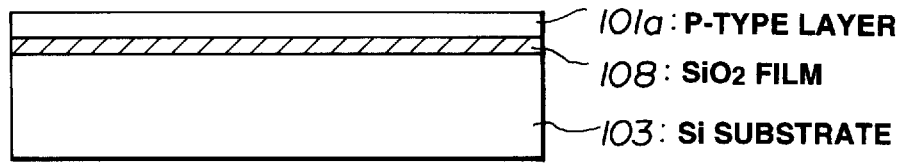
FIGS. 18 through 22 are cross-sectional views illustrating a method for manufacturing an SOI substrate according to a fourth embodiment of the present invention.

FIG. 18 illustrates the structure of an SOI substrate according to a fourth embodiment of the present invention. As shown in FIG. 18, a silicon dioxide film 108, and a single-crystal silicon layer 101a whose impurity density is reduced by out diffusion are present in this sequence on a Si substrate 103. This SOI substrate has the same structure as that of the first embodiment. The present embodiment has a feature in that a first substrate is bonded to a second substrate after oxidizing a surface of the first substrate where a layer having a high impurity density is formed. An insulating film, such as a silicon oxide film, a silicon nitride film or the like, may be formed on a surface of the second substrate to be bonded to the first substrate.

Figure 19:
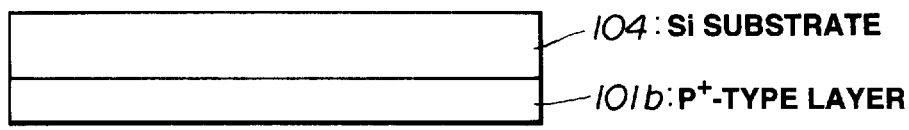

FIGS. 19 through 22 illustrate a method for manufacturing the SOI substrate of the present embodiment. As shown in FIG. 19, a high-density impurity layer 101b is formed in the surface of a silicon substrate 104. The high-density impurity layer 101b may be formed in the same manner as in other embodiments. However, since the surface is oxidized in the following step, the impurity must be deeply diffused by increasing the heat treatment time period. In the present embodiment, a depth of 1.6 μm was obtained by performing boron diffusion into the Si substrate 104 for 60 minutes at 1050° C.

Figure 20:
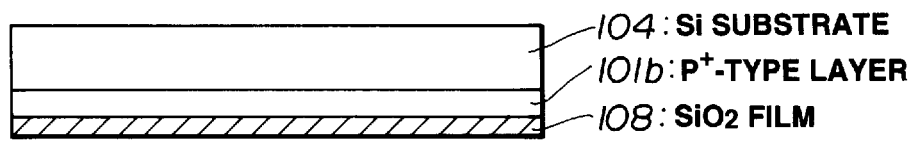

Thereafter, as shown in FIG. 20, a thermal oxide film 108 having a thickness of 3000 angstroms is formed by oxidizing this wafer for 25 minutes at 1000° C. in a mixed gas of H$_2$/O$_2$. The oxide film 108 may have a thickness of 50–3000 angstroms. Since the depth of penetration of boron changes depending on the thickness of the oxide film 108, the thickness of the oxide film 108 and the depth of boron diffusion can be determined in accordance with the required thickness of the Si film.

Figure 21:
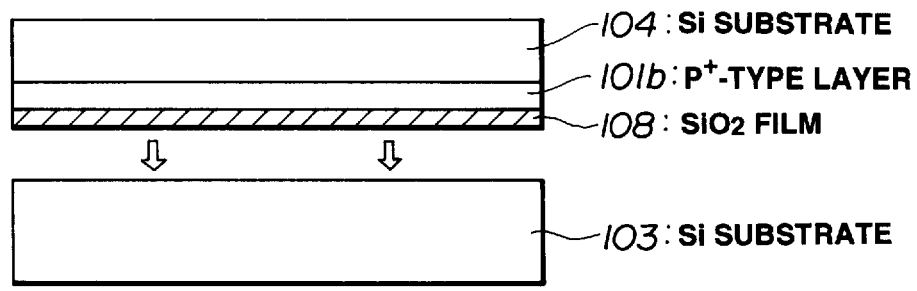
Figure 22:
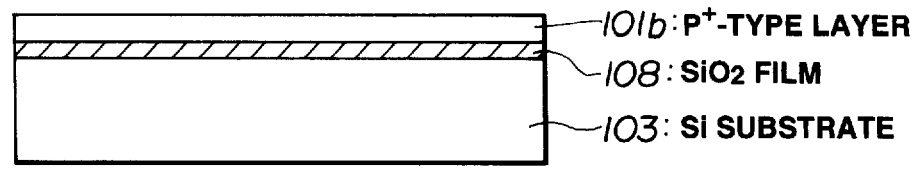

Thereafter, as shown in FIG. 21, this substrate is bonded to the second Si substrate 103. Then, as shown in FIG. 22, the portion of the bonded Si substrate 104 is removed by etching. One of the methods used in the above-described four embodiments may be used for the etching. In the present embodiment, the p$^+$-type layer 101b was thinned to 10 μm using KOH, and then further thinned to 5000±70 angstroms using KOH+2-% IPA.

Thereafter, the impurity density of the p$^+$-type layer 101b was reduced to $10^{16}$ cm$^{-3}$ by out diffusion of boron caused by heat treatment for 1500 minutes at 1100° C. in Ar, and an SOI substrate as shown in FIG. 18 was manufactured. The number of defects in the obtained Si film was as small as in a bulk wafer.

In the present embodiment, since the boundary between the p-type Si layer 101a and the oxide film 108 is formed by thermal oxidation, an SOI substrate having excellent boundary characteristics can be obtained. These excellent boundary characteristics contribute to a high production yield and high reliability of integrated circuits.

Particularly when using boron, a part of boron is transferred into the oxide film when oxidizing the high-impurity-density surface, and the boron density within the Si film more or less decreases. Accordingly, the time required for reducing the impurity density by out diffusion can be reduced.

Fifth Embodiment

FIGS. 23 through 27 illustrate a method for manufacturing an SOI according to a fifth embodiment of the present invention. The present embodiment has a feature in that a p$^+$-type boron-doped layer 101b having an impurity density of $10^{19}$–$10^{21}$ cm$^{-3}$ is formed on an Si substrate 104 via an SiO$_2$ substrate 120 having a thickness of several tens to several hundreds of angstroms.

Figure 23:
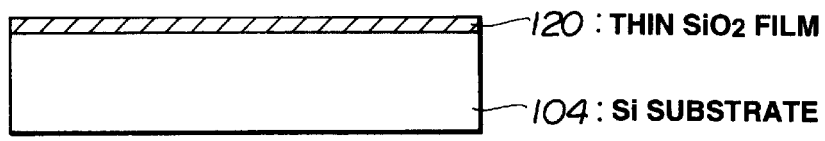
FIGS. 23 through 27 are cross-sectional views illustrating a method for manufacturing an SOI substrate according to a fifth embodiment of the present invention.

First, as shown in FIG. 23, the SiO$_2$ film 120 having a thickness of several tens to several hundreds of angstroms is formed in the surface of the Si substrate 104. In the present embodiment, a thin SiO$_2$ film 120 having a thickness of about 20 angstroms was formed by performing thermal oxidation of the Si substrate 104 for 10–20 minutes in a furnace maintained at 400° C. A thin $SiO_2$ film 120 may also be formed by dipping the Si substrate 104 in an aqueous solution of $H_2O_2$, including a Pt piece, maintained at a temperature of 20°–30° C. for 30–60 minutes. $H_2O_2$ is decomposed by the Pt catalyst as $H_2O_2 \rightarrow H_2O+O^{2-}+2h^+$ ($h^+$:a hole), and a thin $SiO_2$ film 120 is formed in the surface of the Si substrate 104 by the generated $O^{2-}$ having a strong oxidizing capability.

The above-described thin oxide film having a thickness of about 20 angstroms may also be chemically formed by the following methods.

(1) A thin oxide film was formed on a Si wafer by dipping it in a solution of $H_2SO_4$:$H_2O_2$=4:1 for 10 minutes at 120° C. The oxide film was etched by the above-described buffered hydrofluoric acid. The etching rate was between 5 angstroms/min and 15 angstroms/min.

(2) A thin oxide film was formed on a Si wafer by dipping it in $H_2O$ including 2-ppm ozone $O_3$ for 10 minutes at 30° C. The oxide film was etched by the above-described buffered hydrofluoric acid. The etching rate was between 20 angstroms/min and 40 angstroms/min.

(3) A thin oxide film was formed on a Si wafer by dipping it in $H_2O$ including 30-% $H_2O_2$ for 10 minutes at 90° C. The oxide film was etched by the above-described buffered hydrofluoric acid. The etching rate was between 15 angstroms/min and 30 angstroms/min.

(4) A thin oxide film was formed on a Si wafer by dipping it in a solution of $NH_4OH$:$H_2O_2$:$H_2O$=0.05:1:5 for 10 minutes at 90° C. The oxide film was etched by the above-described buffered hydrofluoric acid. The etching rate was between 10 angstroms/min and 20 angstroms/min.

(5) A thin oxide film was formed on a Si wafer by dipping it in a solution of $HCl$:$H_2O_2$:$H_2O$=1:1:6 for 10 minutes at 90° C. The oxide film was etched by the above-described buffered hydrofluoric acid. The etching rate was between 20 angstroms/min and 40 angstroms/min.

Figure 24:
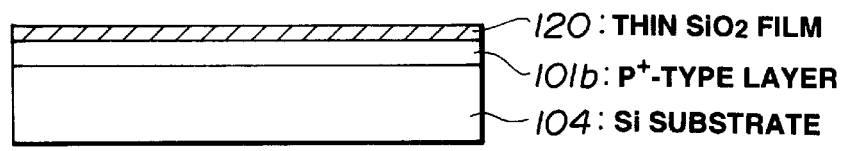

Thereafter, as shown in FIG. 24, a $p^+$-type boron-doped layer 101b is formed via the thin $SiO_2$ film 120. Since this film has a thickness of several tens of angstroms and is therefore very thin, this film barely acts as a barrier for boron diffusion. Hence, the method of forming a $p^+$-type boron-doped layer in the first embodiment can be adopted without modification. In the present embodiment, after performing spin coating of a polyboron film (product name: MK-31) made by Tokyo Ohka Kogyo Co., Ltd., the film was subjected to heat treatment for 30 minutes at 140° C. in the atmospheric air, and then to heat treatment for 30 minutes at 600° C. in an $O_2$ gas. The film was further subjected to heat treatment for 30 minutes at 1050° C. in $N_2$, and the $p^+$-type layer 101b having a surface density of $10^{20}$ $cm^{-3}$ and a depth of 1.2 $\mu m$ was obtained.

Figure 25:
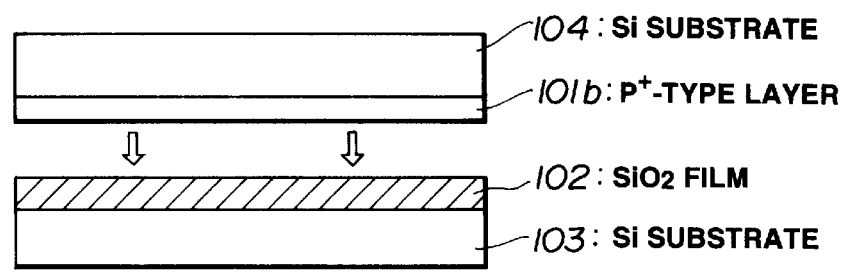
Figure 26:
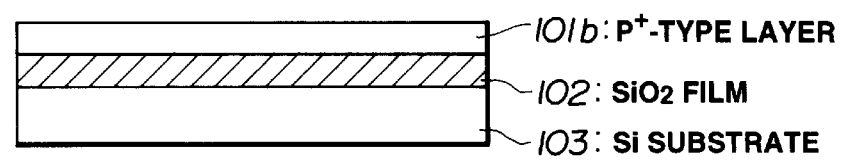

Thereafter, the thin $SiO_2$ film 120 is removed by a diluted solution of hydrofluoric acid, and as shown in FIG. 25, this wafer and another Si wafer 103 whose surface is subjected to thermal oxidation are bonded together after washing them in the same manner as in the first embodiment. In this case, particles, carbon compounds, metallic atoms and the like adhering to the surface of the $p^+$-type boron-doped layer 101b when it has been formed are removed together with the thin $SiO_2$ film 120 when removing the $SiO_2$ film 120. Accordingly, the present embodiment is effective, for example, for reducing voids caused by particles and the like, and for preventing generation of boundary levels due to metallic atoms.

In another approach, the above-described wafer may be bonded to another Si wafer whose surface is subjected to thermal oxidation without removing the thin $SiO_2$ film 120. In this case, since the bonded surfaces are covered with oxide films, particles, carbon compounds, metallic atoms and the like have less possibility of adhering to the surfaces, and therefore, for example, the number of voids can be reduced.

In the SOI substrate manufactured according to this method, since the boundary between the single-crystal Si and the insulating film $SiO_2$ is formed by thermal oxidation, excellent boundary characteristics in the electrical property are provided.

Figure 27:
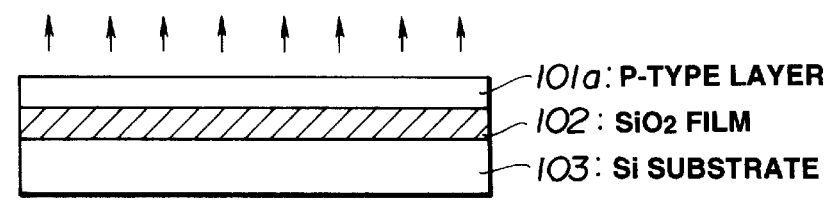

The same methods as in the first embodiment may be used for removing the Si wafer 104 (see FIG. 26) and for performing out diffusion of boron (see FIG. 27).

A description will now be provided of evaluation of characteristics for the $SiO_2$ film 120. When the etching rate by a buffered hydrofluoric acid, comprising a mixture of a very small amount of hydrofluoric acid and ammonia water, for an oxide film obtained by wet thermal oxidation at 1000° C. is 1 angstrom/min, the etching rate by this buffered hydrofluoric acid for the $SiO_2$ film 120 was measured. The measured value was 2 angstroms/min which is twice the above-described value.

The temperature of thermal oxidation was gradually decreased when forming the $SiO_2$ film 120, and the etching rate by the above-described buffered hydrofluoric acid for the grown film was measured. The etching rate in the case of oxidation at 600° C. was about 1.5–1.8 times the etching rate in the case of wet oxidation at 1000° C., but the number of voids when bonding two wafers via this film (without removing the oxide film) was not so much reduced. However, when thermal oxidation was performed at 400° C. in the above-described manner, the etching rate was about twice the etching rate in the case of wet oxidation at 1000° C., and the number of voids was reduced by at least about one order to magnitude. Accordingly, in order to reduce the number of voids, it is preferable to use an oxide film not including an impurity and having an etching rate at least twice the etching rate of the above-described oxide film formed by wet thermal oxidation at 1000° C. by the buffered hydrofluoric acid.

The etching rate of the above-described thin $SiO_2$ film 120, formed by dipping the Si substrate 104 in the aqueous solution of $H_2O_2$ including the Pt piece maintained at 20°–30° C. for 30–60 minutes, by the above-described buffered hydrofluoric acid was between 5 angstroms/min and 40 angstroms/min. This rate changes depending on the amount of $H_2O_2$ and the processing temperature. It was confirmed that as the etching rate is higher, the number of voids decreases and therefore a better oxide film is obtained.

In the above-described fifth embodiment, since the $p^+$-type boron-doped layer 101b is formed by diffusing boron via the thin $SiO_2$ film 120, the two Si substrates can be bonded together without causing particles, heavy metals and the like to adhere to the Si thin film. Accordingly, it is possible to prevent the generation of voids, and to achieve a high production yield in the manufacture of SOI substrates.

Sixth Embodiment

The present embodiment has a feature in that the out-diffusion process in the first through fifth embodiments is performed under a reduced pressure, in a $H_2$ atmosphere, or in a reduced $H_2$ atmosphere. When out diffusion is performed under a reduced pressure, an impurity, such as born, arsenic or phosphorous, discharged from the surface of a wafer is rapidly removed from the surface of the wafer, impurity discharge does not become in equilibrium, and the time of the out-diffusion process is shortened.

When out diffusion is performed in a $H_2$ atmosphere, since $H_2$, which is a reducing gas, has the effect of preventing formation of a thermal oxide film or a thermal nitride film on the surface of a Si wafer, disturbance of discharge of boron by an oxide film is prevented. The same effect is also obtained by mixing an inert gas, such as He, Ar or the like. When out diffusion is performed in a $H_2$ atmosphere, an impurity, such as boron, arsenic or phosphorous, discharged from the surface of a wafer combines with hydrogen, and is removed from the surface of the wafer as boron hydride ($B_xH_y$), phosphorous hydride ($As_xH_y$) or phosphorous hydride ($P_xH_y$), respectively. Hence, the time of the out-diffusion process is shortened. Hydrogen atoms in the $H_2$ atmosphere enter the wafer, and are trapped in crystal defects produced by the high-density impurity levels caused by crystal defects produced by vacancies of the impurity, or boundary levels in the Si—$SiO_2$ boundary, to suppress the activity of these unnecessary levels, and to reduce the generation of leakage current and dark current in an obtained device.

Figure 28:
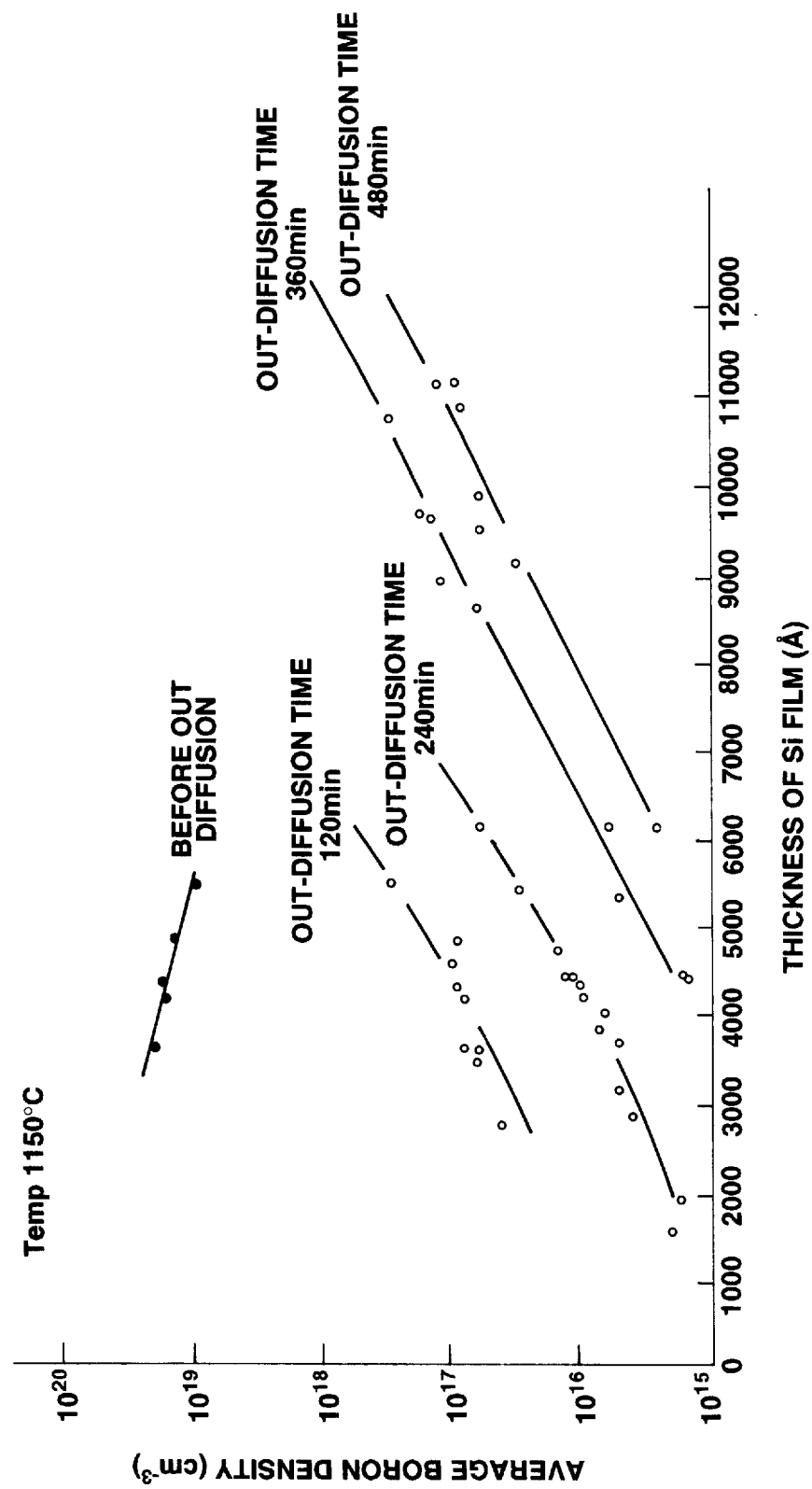
FIG. 28 is a graph indicating results of out diffusion under a reduced pressure and in an H$_2$ atmosphere.
Figure 29:
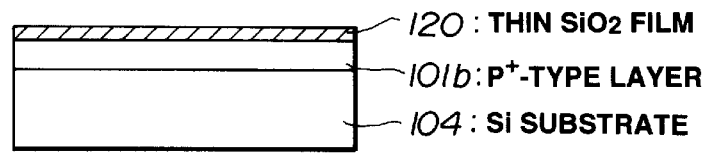
FIGS. 29 through 33 are cross-sectional views illustrating a method for manufacturing an SOI substrate according to a seventh embodiment of the present invention.

In the present embodiment, out diffusion was performed with the effects of a reduced pressure and a $H_2$ atmosphere. The out diffusion was performed under the conditions of a pressure of $10^{-7}$–500 Torr, a $H_2$ flow rate of 10 liters/min–200 liters/min, and a temperature of 1000° C.–1300° C. As an example, FIG. 28 illustrates the results of experiments of out diffusion of boron at a pressure of 80 Torr, an $H_2$ flow rate of 100 liters/min, and a temperature of 1150° C. In FIG. 28, the abscissa represents the thickness of the Si film, and the average boron density within the Si film is plotted making the out-diffusion time as a parameter. The boron density before the out diffusion is $5 \times 10^{18}$–$3 \times 10^{19}$, and the thickness of the Si film of the SOI is 1600–11100 angstroms.

The average density of boron within the Si film was measured. It can be confirmed that the boron density within the Si film decreases as the out-diffusion time increases, and boron is more effectively discharged as the thickness of the Si film is smaller. The average boron density within the Si film can be reduced to the order of $10^{15}$ cm$^{-3}$ when the thickness of the Si film is less than 6000 angstroms.

In the present embodiment, the process time is shorter than in the conventional out-diffusion process by adopting a low-pressure $H_2$ atmosphere at a higher temperature. As a result, it is possible to increase the throughput, and to realize an SOI substrate having a high-quality Si film caused by being annealed in $H_2$.

Seventh Embodiment

Figure 30:
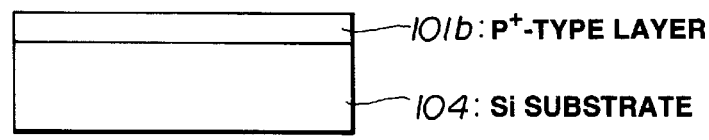

FIGS. 29 through 33 illustrate a method for manufacturing a SOI substrate according to a seventh embodiment of the present invention. The manufacturing process from the process of forming a p$^+$-type boron-doped layer 101b via an $SiO_2$ film 120 having a thickness of several tens to several hundreds of angstroms shown in FIG. 29 to the process of removing the $SiO_2$ film shown in FIG. 30 is the same as in the fifth embodiment. The present embodiment has a feature in that an $SiO_2$ film 121 having a thickness of several hundreds to several thousands of angstroms by performing thermal oxidation of the surface of the p$^+$-type boron-doped layer 101b, and the $SiO_2$ film 121 and another Si wafer 103 are bonded together. In the present embodiment, an $SiO_2$ film 121 having a thickness of about 4000 angstroms was formed by performing wet thermal oxidation of an Si wafer 104 for about one hour in a furnace maintained at 1000° C.

Figure 31:
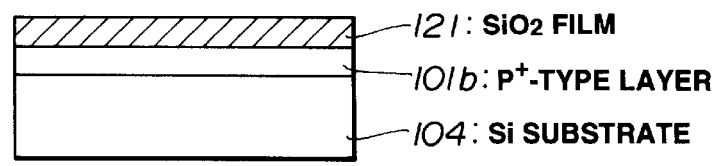
Figure 32:
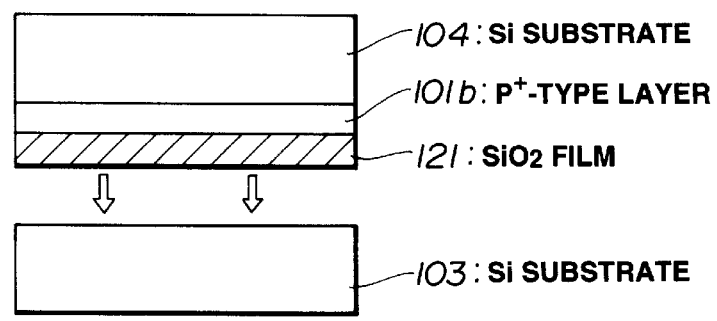
Figure 33:
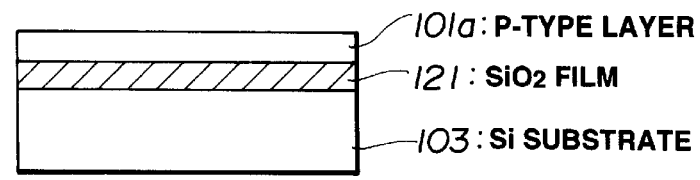
Figure 34:
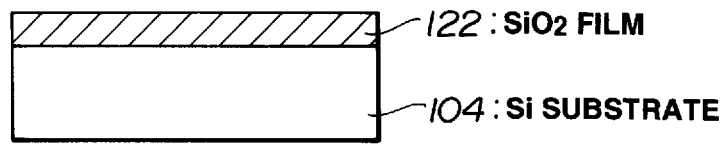
FIGS. 34 through 37 are cross-sectional views illustrating a method for manufacturing an SOI substrate according to an eighth embodiment of the present invention.
Figure 35:
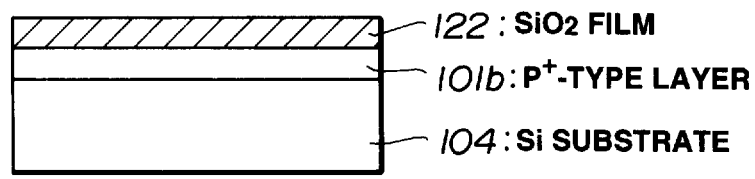
Figure 36:
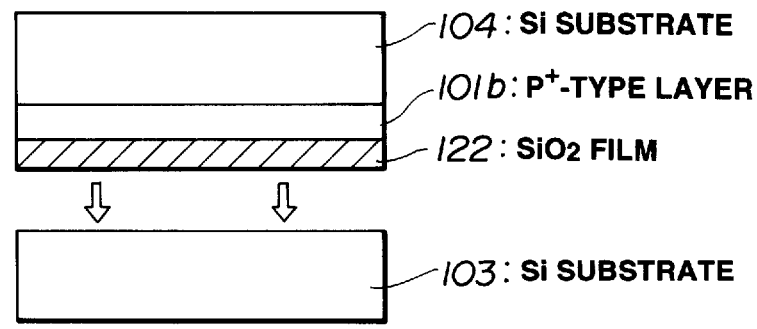
Figure 37:
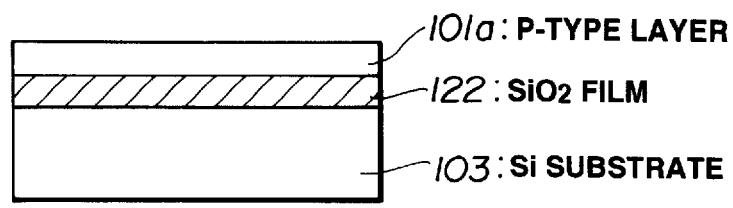

(see FIG. 31). The bonding step shown in FIGS. 32 and 33 and the process of removing the Si wafer 104 which follow the oxidation step are the same as in the first embodiment, and the subsequent out-diffusion process is the same as in the sixth embodiment.

The SOI substrate manufactured in the present embodiment has excellent electrical boundary characteristics because the boundary between a single-crystal Si layer 101a and the insulating ($SiO_2$) film 121 is formed by thermal oxidation. Hence, it is possible to provide an SOI device having high reliability with a high production yield.

Eighth Embodiment

FIGS. 34 through 37 illustrate a method for manufacturing an SOI substrate according to an eighth embodiment of the present invention. The present embodiment has a feature in that a $SiO_2$ film 122 having a thickness of several hundreds to several thousands of angstroms is formed by thermal oxidation of an Si wafer 104, a p$^+$-type boron-doped layer 101b is then formed by implanting boron via the $SiO_2$ film 122, and thereafter the $SiO_2$ film 122 is bonded to another Si wafer 103.

In the present embodiment, the oxide film 122 having a thickness of about 4000 angstroms is formed by performing wet thermal oxidation of the Si wafer 104 for one hour in a furnace maintained at 1000° C. (see FIG. 34). Then, the p$^+$-type boron-doped layer 101b having a thickness of about 1.0 $\mu$m is formed by implanting boron at a dose rate of $10^{16}$ cm$^{-2}$ with 100 keV (see FIG. 35). The bonding process shown in FIGS. 36 and 37, and the process of removing the Si wafer 104 are the same as in the first embodiment, and the subsequent out-diffusion process is the same as in the seventh embodiment.

In the SOI substrate manufactured in the present embodiment, the process in which heat is applied after forming the p$^+$-type boron-doped layer 101b is only the bonding process. Hence, the profile of the p$^+$-type boron-doped layer 101b is abrupt, the selection ratio p$^+$/p$^-$ at etching in the process of removing the Si wafer 104 increases, and therefore a SOI substrate in which the thickness of the Si film 101a is more uniform than in the fourth and seventh embodiments can be obtained. In addition, since the boundary between the Si film 101a and the $SiO_2$ film 122 is formed by thermal oxidation, it is possible to provide an SOI device having high reliability with a high production yield.

The individual components shown in outline in the drawings are all well known in the semiconductor substrate arts and their specific construction and operation are not critical to the operation or the best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for manufacturing a semiconductor substrate consisting essentially of the steps of:

forming a semiconductor substrate including an impurity layer with an impurity density at the side of its surface;

bonding the impurity layer of the semiconductor substrate and an insulating layer provided on another substrate;

removing the semiconductor substrate except the impurity layer; and reducing the impurity density of the remaining impurity layer by out diffusion under a reduced pressure.

2. A method according to claim 1, wherein the semiconductor substrate comprises silicon, and wherein the insulating layer comprises silicon oxide.

3. A method according to claim 1, wherein the semiconductor substrate comprises silicon, and wherein the insulating layer comprises silicon nitride.

4. A method according to claim 1, wherein the semiconductor substrate comprises silicon, and wherein the insulating layer comprises silicon nitride oxide.

5. A method according to claim 1, wherein a thin oxide film is formed on the impurity layer before the bonding step, and the bonding is performed after removing the oxide film.

6. A method according to claim 1, wherein a thin oxide film is formed on the impurity layer before the bonding step, and the bonding is performed via the oxide film.

7. A method for manufacturing a semiconductor substrate consisting essentially of the steps of:

forming a semiconductor substrate including an insulating layer in contact with an impurity layer with an impurity density at the side of its surface;

bonding the surface of the insulating layer of the semiconductor substrate and a surface of another substrate;

removing the semiconductor substrate except the impurity layer and the insulating layer; and reducing the impurity density of the remaining impurity layer by out diffusion under a reduced pressure.

8. A method according to claim 7, wherein the semiconductor substrate comprises silicon, and wherein the insulating layer comprises silicon oxide.

9. A method according to claim 7, wherein the semiconductor substrate comprises silicon, and wherein the insulating layer comprises silicon nitride.

10. A method according to claim 7, wherein the semiconductor substrate comprises silicon, and wherein the insulating layer comprises silicon nitride oxide.

* * * * *